(12) United States Patent
Loy et al.

(10) Patent No.: US 7,656,649 B2
(45) Date of Patent: Feb. 2, 2010

(54) MECHANICAL PACKAGING APPARATUS AND METHODS FOR AN ELECTRICAL ENERGY METER

(75) Inventors: Garry M. Loy, Raleigh, NC (US); Robert T. Mason, Jr., Raleigh, NC (US); Rodney C. Hemminger, Raleigh, NC (US); Robert Fuller, West Bend, WI (US)

(73) Assignee: Elster Electricity, LLC, Raleigh, NC (US)

( * ) Notice: Subject to any disclaimer, the term of this patent is extended or adjusted under 35 U.S.C. 154(b) by 0 days.

(21) Appl. No.: 12/342,199

(22) Filed: Dec. 23, 2008

(65) Prior Publication Data
US 2009/0168307 A1 Jul. 2, 2009

Related U.S. Application Data

(60) Provisional application No. 61/016,776, filed on Dec. 26, 2007.

(51) Int. Cl.
*G01R 1/04* (2006.01)
*H02B 1/00* (2006.01)
(52) U.S. Cl. .................. 361/659; 361/661; 361/664; 361/667; 324/142
(58) Field of Classification Search ......... 361/659–672; 324/74, 110, 142; 29/592.1; D10/100
See application file for complete search history.

(56) References Cited

U.S. PATENT DOCUMENTS

| | | | | |
|---|---|---|---|---|
| 1,898,634 A | * | 2/1933 | Lewis .................... | 361/663 |
| 3,397,346 A | * | 8/1968 | Sloop .................... | 361/666 |
| 4,226,102 A | * | 10/1980 | Mattress, Jr. ............ | 70/164 |
| 5,001,420 A | | 3/1991 | Germer et al. | |
| 5,033,973 A | * | 7/1991 | Pruehs et al. ............ | 439/167 |
| 5,041,001 A | * | 8/1991 | Giles .................... | 439/189 |
| 5,097,383 A | * | 3/1992 | Heard et al. ............. | 361/662 |
| 5,216,802 A | * | 6/1993 | Cole et al. .............. | 29/825 |
| 5,404,266 A | * | 4/1995 | Orchard et al. .......... | 361/667 |
| 5,546,269 A | * | 8/1996 | Robinson et al. ......... | 361/660 |
| 5,572,396 A | * | 11/1996 | Robinson ................ | 361/117 |
| 5,774,328 A | * | 6/1998 | Rector et al. ............ | 361/667 |
| D409,934 S | | 5/1999 | Houck et al. | |

(Continued)

FOREIGN PATENT DOCUMENTS

EP 1538449 A2 * 6/2005

(Continued)

*Primary Examiner*—Anatoly Vortman
(74) *Attorney, Agent, or Firm*—Woodcock Washburn LLP

(57) ABSTRACT

An electric meter comprises an electronics housing and a meter base. The electronics housing defines a front panel and includes a first plurality of option board guides. A main meter board is disposed substantially parallel to the front panel. The meter base defines a rear panel of the electric meter. The meter base includes a plurality of housing guides for receiving the electronics housing and a second plurality of option board guides disposed substantially perpendicularly to the rear panel. The second plurality of option board guides are adapted to receive an option board and to position the option board substantially perpendicularly to the main meter board of the electronics housing during assembly of the electronics housing to the meter base. The housing guides in combination with the first and second pluralities of option board guides enable blind assembly of the electronics housing to the meter base.

30 Claims, 7 Drawing Sheets

U.S. PATENT DOCUMENTS

| | | | |
|---|---|---|---|
| 5,966,010 | A | 10/1999 | Loy et al. |
| 5,997,347 | A * | 12/1999 | Robinson et al. ............ 439/517 |
| 6,522,124 | B1 | 2/2003 | Ballard |
| 6,528,986 | B2 | 3/2003 | Ballard |
| 6,545,374 | B1 * | 4/2003 | Allenbach .................. 307/125 |
| 6,589,072 | B2 * | 7/2003 | Robinson et al. ............ 439/517 |
| 6,605,937 | B2 * | 8/2003 | Germer et al. .............. 324/157 |
| 6,677,742 | B1 | 1/2004 | Voisine et al. |
| 6,687,627 | B1 * | 2/2004 | Gunn et al. .................. 702/61 |
| 6,734,663 | B2 | 5/2004 | Fye et al. |
| 6,754,067 | B2 | 6/2004 | Turner et al. |
| 6,773,652 | B2 * | 8/2004 | Loy et al. .................. 264/274 |
| 6,798,191 | B1 * | 9/2004 | Macfarlane et al. ......... 324/157 |
| 6,838,867 | B2 | 1/2005 | Loy |
| 6,882,523 | B2 | 4/2005 | Turner et al. |
| 6,885,185 | B1 | 4/2005 | Makinson et al. |
| 6,940,711 | B2 * | 9/2005 | Heuell et al. ................ 361/668 |
| 6,956,733 | B2 * | 10/2005 | Beasley et al. .............. 361/641 |
| 6,983,211 | B2 | 1/2006 | MacFarlene et al. |
| 6,989,667 | B2 | 1/2006 | Loy |
| 7,064,679 | B2 | 6/2006 | Ehrke et al. |
| 7,161,455 | B2 | 1/2007 | Tate et al. |
| 7,253,605 | B2 | 8/2007 | Burns et al. |
| 7,265,532 | B2 * | 9/2007 | Karanam et al. ............ 324/142 |
| 7,274,187 | B2 | 9/2007 | Loy |
| 7,277,027 | B2 | 10/2007 | Ehrke et al. |
| 7,397,652 | B2 * | 7/2008 | Price et al. .................. 361/643 |
| 7,540,766 | B2 * | 6/2009 | Makinson et al. ........... 439/517 |
| 2005/0270016 | A1 * | 12/2005 | Karanam et al. ............ 324/157 |
| 2006/0158177 | A1 | 7/2006 | Ramirez |

FOREIGN PATENT DOCUMENTS

| | | |
|---|---|---|
| WO | WO 02/088642 A1 * | 11/2002 |
| WO | WO 2005001994 A2 * | 1/2005 |

* cited by examiner

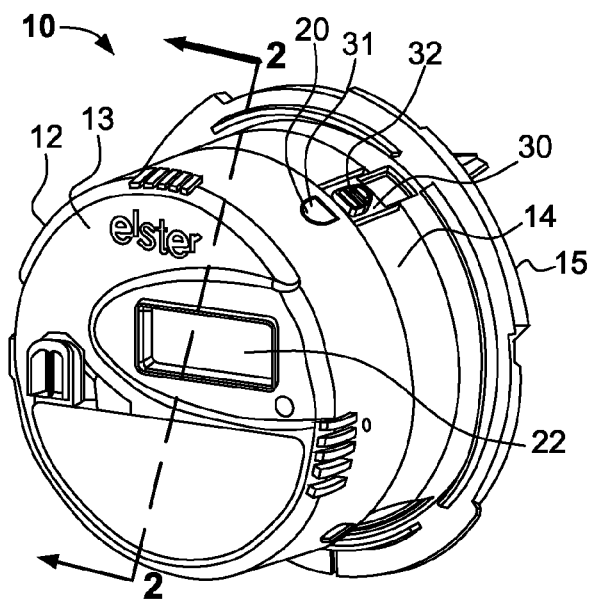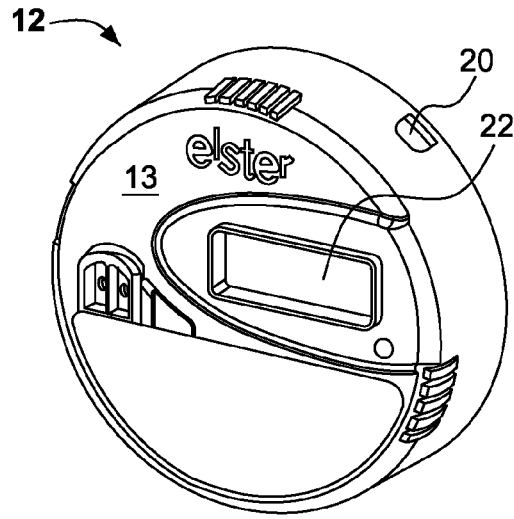
FIG. 1A  FIG. 1B
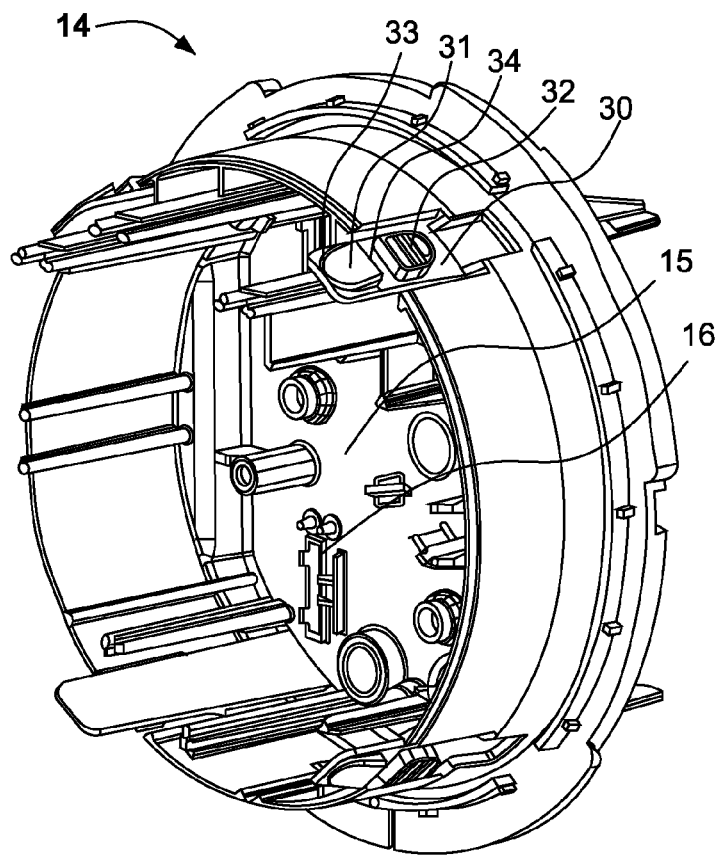
FIG. 1C

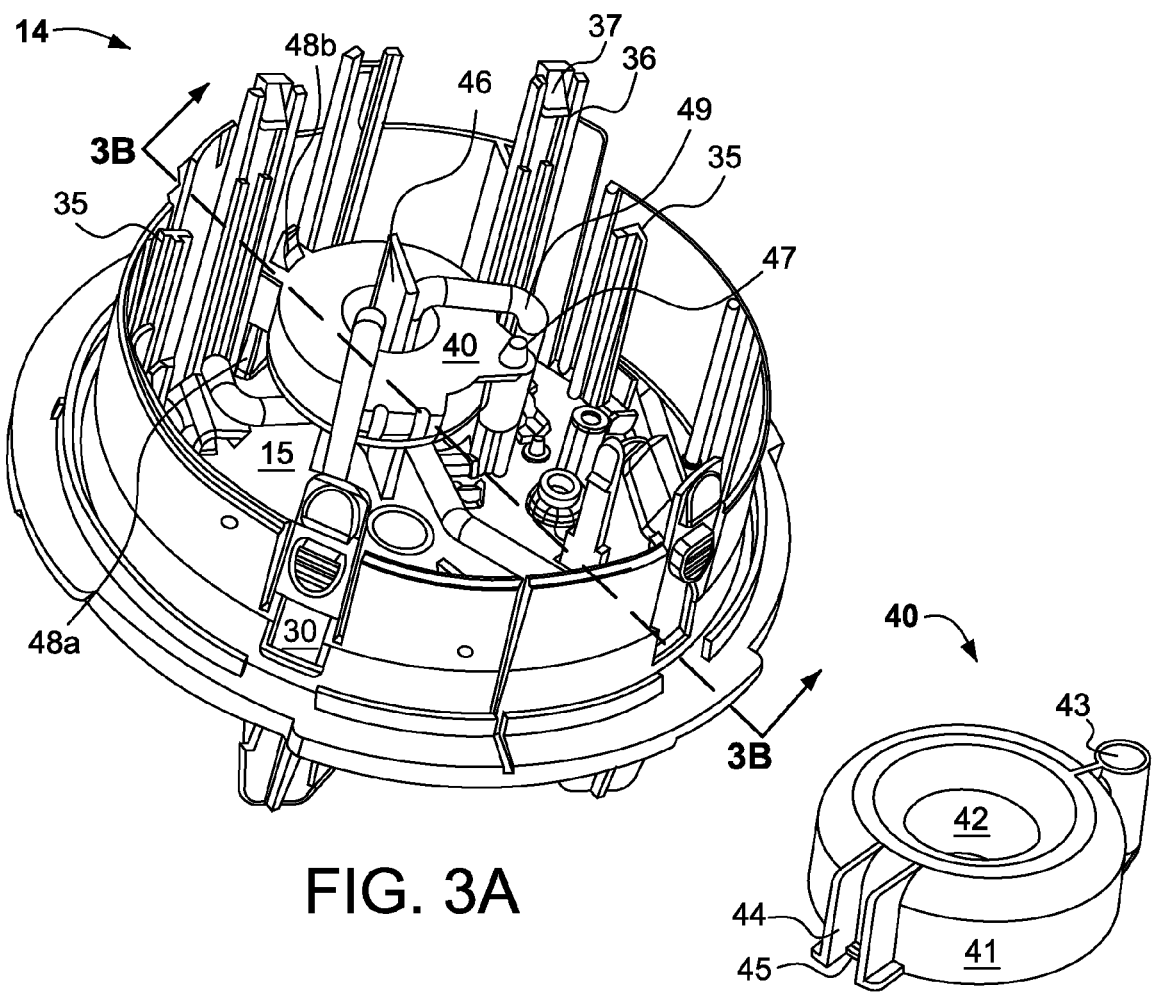
FIG. 3A
FIG. 3D
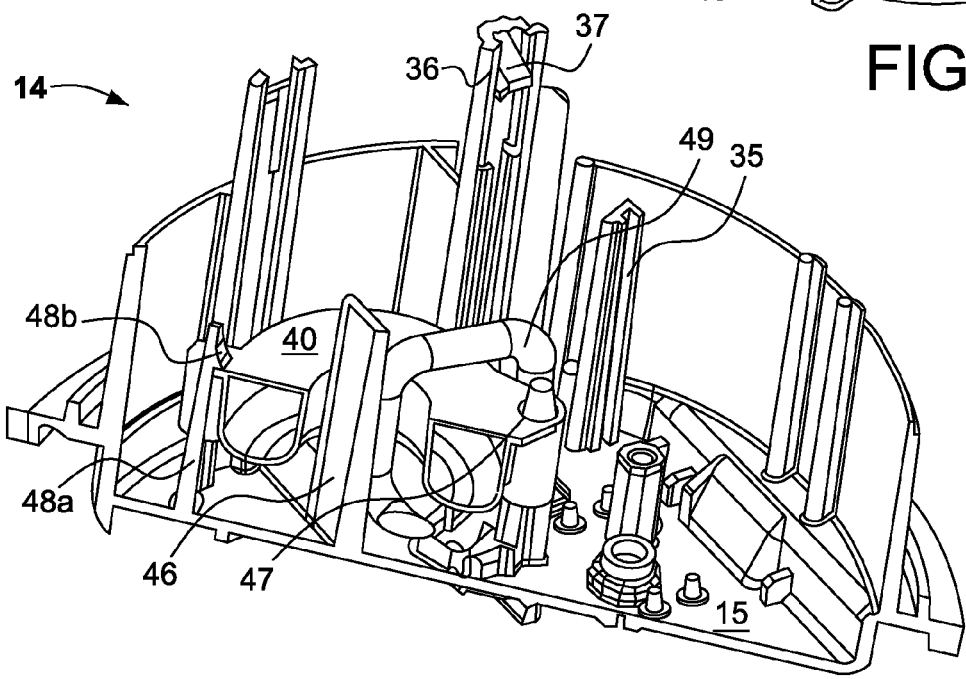
FIG. 3B

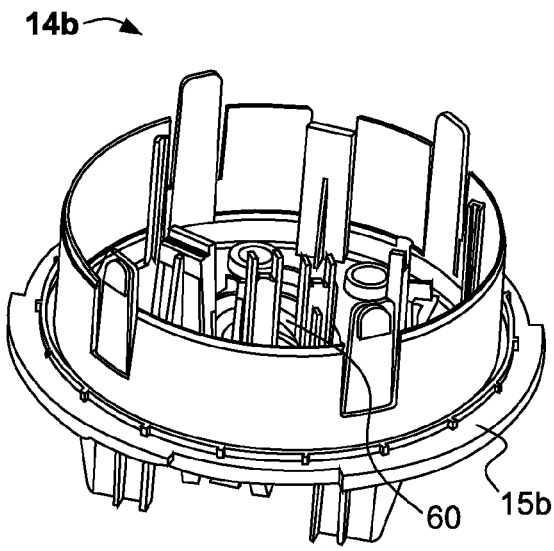
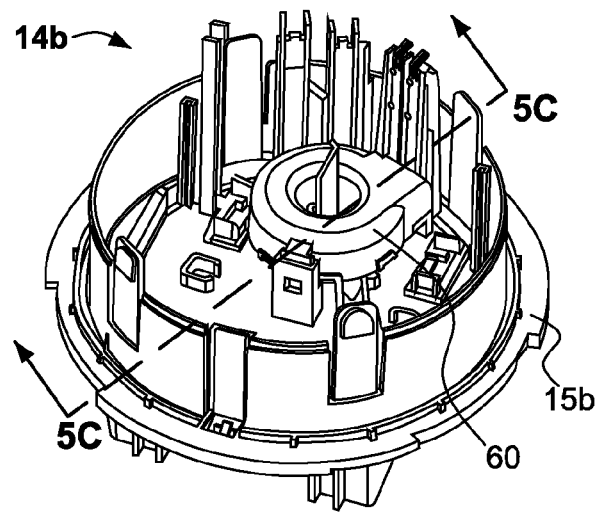
FIG. 5A      FIG. 5B
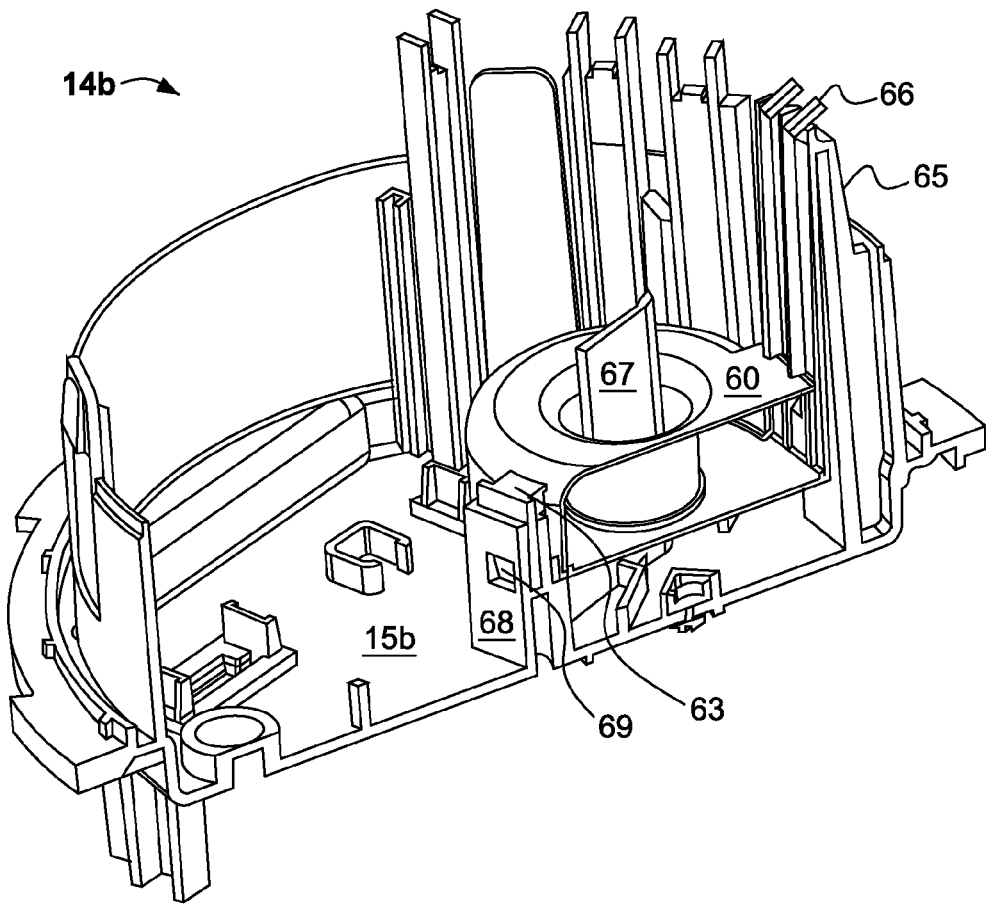
FIG. 5C

MECHANICAL PACKAGING APPARATUS AND METHODS FOR AN ELECTRICAL ENERGY METER

CROSS-REFERENCE TO RELATED APPLICATIONS

This application claims priority to provisional U.S. patent application No. 61/016,776, filed Dec. 26, 2007, the contents of which are incorporated herein by reference in their entirety.

TECHNICAL FIELD

The present invention relates to electrical-energy meters. More particularly, the invention relates to mechanical packaging methods and apparatus for such meters.

BACKGROUND

Historically, residential electric power consumption has been measured with electromechanical meters. These electromechanical devices have long been priced as commodities, dependent on the extremely low cost of materials and volume manufacturing processes. In today's residential meter market there is a shift away from electromechanical meters to electronic meters, with a focus still on minimizing product cost. There are several major providers of solid state electric meters, each with a different design approach to deliver essentially the same set of standards-based power-measuring functionality.

Some current electric meter designs comprise an electronics housing, including a main circuit board, and a meter base, including a current sensing module. Typically, such electric meter designs require a user to manually couple the electronics housing to the meter base. The manual installation process may take a substantial amount of time, during which a user may have to carefully connect and align various included electric meter components. The complexity of the manual installation process of a typical electric meter may substantially increase the cost of providing the electric meter at a residential location.

SUMMARY

An electric meter is disclosed, comprising an electronics housing and a meter base. The electronics housing defines a front panel of the meter and includes a first plurality of option board guides and a main meter board disposed substantially parallel to the front panel. The meter base defines a rear panel of the meter. The meter base includes a plurality of housing guides for receiving the electronics housing and a second plurality of option board guides disposed substantially perpendicularly to the rear panel. The second plurality of option board guides are adapted to receive an option board and to position the option board substantially perpendicularly to the main meter board of the electronics housing during assembly of the electronics housing to the meter base. The housing guides in combination with the first and second pluralities of option board guides enable blind assembly of the electronics housing to the meter base.

A method of assembling the electric meter is also disclosed. According to the method, an option board is inserted into the second plurality of option board guides of the meter base, and then a blind assembly of the electronics housing to the meter base is performed. The option board and main board are connected during said blind assembly.

These and various other features of the electric meter and method for assembling same are described below.

BRIEF DESCRIPTION OF THE DRAWINGS

FIG. 1A is a top perspective view of an electric meter, according to a first embodiment of the present invention;

FIG. 1B is a top perspective view of the electronics housing depicted in FIG. 1A;

FIG. 1C is a top perspective view of the meter base depicted in FIG. 1A;

FIG. 3A is a top perspective view of the meter base depicted in FIG. 1C, including a current transformer;

FIG. 3B is a top perspective sectional view of the meter base depicted in FIG. 3A, taken along the line 3B-3B;

FIG. 3D is a top perspective view of the current transformer depicted in FIG. 3A;

FIG. 5A is a top perspective view of a meter base, according to a third embodiment;

FIG. 5B is a top perspective view of the meter base depicted in FIG. 5A;

FIG. 5C is a top perspective sectional view of the meter base depicted in FIG. 5B, taken along the line 5C-5C;

DETAILED DESCRIPTION OF ILLUSTRATIVE EMBODIMENTS

Figure 2A:
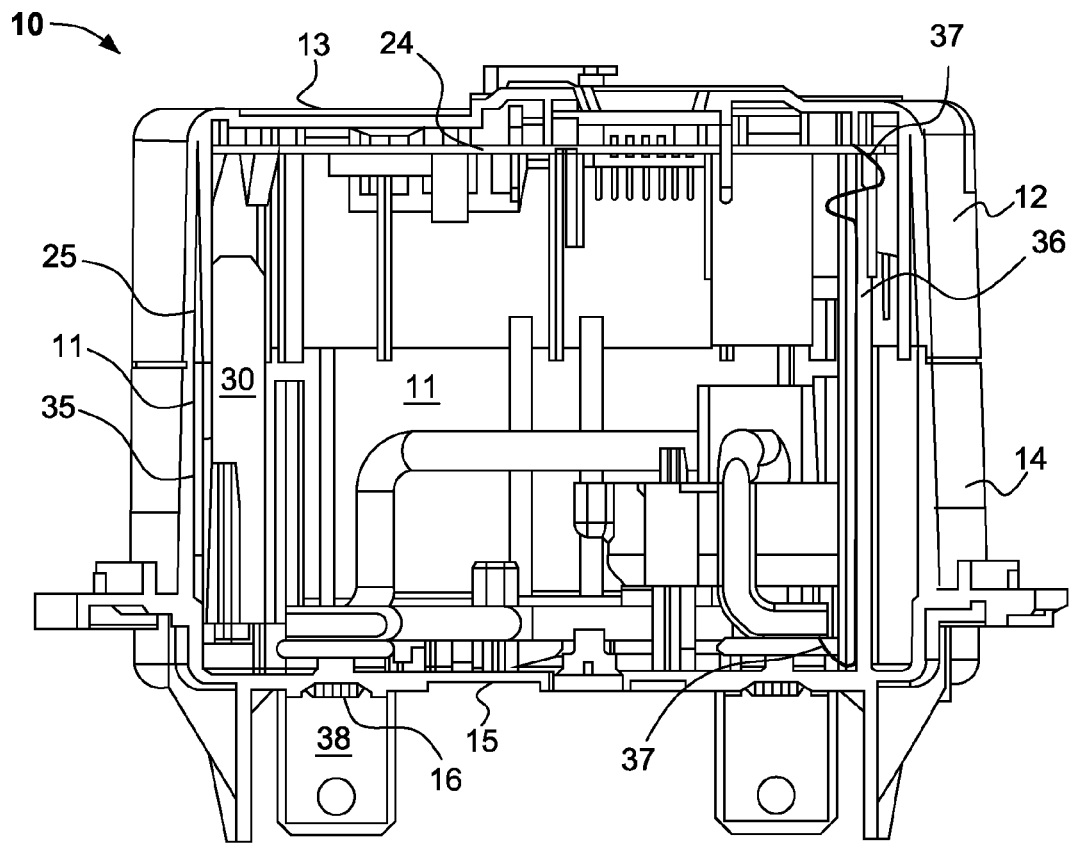
FIG. 2A is a side sectional view of the electric meter depicted in FIG. 1A, taken along the line 2-2.

Referring to FIGS. 1A-1C, an electric meter 10 includes an electronics housing 12 and a meter base 14. The electronics housing 12 includes a front panel 13, one or more hook apertures 20, an indicator screen 22, and a main meter board 24 (shown in FIG. 2A). The meter base 14 includes a rear panel 15, meter terminal blade apertures 16, and one or more housing guides 30. Each housing guide 30 includes a snap hook 31 and a finger pad 32. Each snap hook 31 includes a leading edge 33 and a trailing edge 34. As shown in FIG. 1A, the electric meter 10 provides mechanical packaging for various components, some of which are related to measuring residential electric power consumption.

The electronics housing 12 may contain a main meter board 24 (shown in FIG. 2A). The electronics housing 12 may include an on-board 60 Hz transformer (not shown) and a boss for a single fastener (not shown) that supports the on-board transformer. The electronics housing 12 may provide for the secure positioning of the indicator screen 22 (for example, an LCD display) that may connect to the main meter board 24 (shown in FIG. 2A) via an elastomeric interconnect strip (not shown). The electronics housing 12 may include an optical probe (not shown) that may supports two-way serial communications between the electric meter 10 and an external communication device (not shown).

The meter base 14 may interface to a residential meter socket via a plurality of meter terminal blades 38 (as shown, for example, in FIG. 2A). The meter base 14 may serve as a chassis or framework to support the current conductors (e.g., the voltage contact springs 37 and the meter terminal blades 38 as shown, for example, in FIG. 2A) and the current transformers (e.g., the current sensor 40 as shown, for example, in FIG. 3D) for current sensing. The meter base 14 may include a barrier (not shown) that may provide electrical isolation between the main current carrying conductors (e.g., the meter terminal blades 38).

A fully or partially clear or translucent meter cover (not shown) may be provided around the electric meter 10 to protect the electric meter 10 from external impact or other potential damage (e.g., water), while providing a user visual access to the indicator screen 22 through the meter cover. The electronics housing 12 may include a label that may be visible through the meter cover. The meter cover may be coupled to the meter base 14 near the outer radial edge of the meter base 14, using a twist-on coupling mechanism or any other coupling mechanism that is known in the art.

The electronics housing 12 and the meter base 14 may be made from a rigid molded plastic material such as polycarbonate, although any other rigid material known in the art may be used. The electronics housing 12 and the meter base 14 may have substantially the same diameter, for example, approximately 8 inches, such that the electronics housing 12 can be coupled to the meter base 14 by sliding the electronics housing 12 over the meter base 14 as shown in FIG. 1A. In the embodiment shown, the meter base 14 is made from a single molded piece of plastic. However, in other embodiments, the meter base 14 may be constructed from multiple components that are attached together.

As shown in FIG. 1A, the electronics housing 12 includes a plurality of snap hooks 31 that are configured to fit into the plurality of hook apertures 20. The snap hooks 31 and the corresponding hook apertures 20 may be any size and shape. The snap hooks 31 may be slightly smaller than the corresponding hook apertures 20, such that the snap hooks 31 can fit into the hook apertures 20, thereby allowing the meter base 14 to retain the electronics housing 12. Each snap hook 31 may be tapered from the leading edge 33 to the trailing edge 34, wherein the leading edge 33 has a smaller thickness in the radial direction than the trailing edge 34. The presence of a taper in each snap hook 31 may make it easier for a user to begin to slide the snap hooks 31 into the corresponding apertures 20 when the electronics housing 12 is pressed onto the meter base 14. Although the embodiment shown includes tapered snap hooks 31, in other embodiments, non-tapered snap hooks 31 may be used.

In the embodiment shown, there are four corresponding pairs of snap hooks 31 and hook apertures 20, however, any number of corresponding pairs of snap hooks 31 and hook apertures 20 may be used. Each corresponding pair of snap hooks 31 and hook apertures 20 are located at periodic circumferential positions about the meter base 14 and the electronics housing 12. For example, in the embodiment shown, the pairs of snap hooks 31 and hook apertures 20 are located approximately every 90° degrees around the circumference of the meter base 14 and the electronics housing 12. However, in other embodiments, the snap hooks 31 and hook apertures 20 may be located at any regular or irregular circumferential spacing around the meter base 14 and the electronics housing 12.

Each snap hook 31 and each corresponding finger tab 32 are located on a corresponding housing guide 30. Each housing guide 30 protrudes from the meter base 14 and is able to be flexed radially inward and outward, depending on the direction of a force that is applied to the included snap hook 31 or the finger pad 32. The housing guides 30 may be any length and have any degree of radial stiffness. The housing guides 30 may allow enough radial flexibility such that they can be flexed radially inward to allow the snap hooks 31 to engage the hook apertures 20 when a user pushes the electronics housing 12 onto the meter base 14 with a moderate degree of force, for example, 25 pounds of force.

To actuate the snap hooks 31, the electronics housing 12 is placed over the meter base 14 in the configuration shown in FIG. 1A, such that the snap hooks 31 are approximately disposed at the same circumferential orientation as the corresponding hook apertures 20. The electronics housing 12 then pushed onto the meter base 14 with a moderate degree of force (e.g., 25 pounds). As the electronics housing 12 is pushed onto the meter base 14, the leading edges 33 of the snap hooks 31 enter the hook apertures 20, which begin to apply a radially inward force to the snap hooks 31, thereby deflecting the housing guides 30 radially inward. As the snap hooks 31 increasingly engage the hook apertures 20, the housing guides 30 are deflected increasingly radially inward, until the trailing edges 34 enter the hook apertures 20. When the trailing edges 34 enter the hook apertures 20, the snap hooks 31 and the housing guides 30 move radially outward, and the snap hooks 31 snap into the hook apertures 20, thereby securing the electronics housing 12 onto the meter base 14.

Depending on the particular relative orientation of the electronics housing 12 and the meter base 14, each snap hook 31 may be engaged with the corresponding hook aperture 20 in turn, rather than all at the same time. If the snap hooks 31 are engaged with the corresponding hook apertures 20 in turn, then the force required (at any single moment in time) to snap the electronics housing 12 onto the meter base 14 may be reduced. For example, if a moderate 25 pound pushing force is required to push the electronics housing 12 onto the meter base 14 to engage all four pairs of snap hooks 31 and hook apertures 20, then if each pair of snap hooks 31 and hook apertures 20 is engaged individually, a user may only need to push with a smaller 6.25 pound pushing force to engage a particular pair of a snap hook 31 and a hook aperture 20.

To disengage the snap hooks 31, the finger pads 32 are depressed radially inward such that the housing guides 30 flex radially inward. The inward flexing of the housing guides 30 cause the snap hooks 31 to move radially inward. When the housing guides 30 are flexed radially inward to a sufficient degree such that the snap hooks 31 move radially inward to a distance substantially equal to the depth (in the radial direction) of the trailing edges 34, the snap hooks 31 become disengaged from the hook apertures 20. When all of the snap hooks 31 are disengaged from the respective hook apertures 20, the electronics housing 12 may be removed from the meter base 14.

In the situation where a single user wishes to remove the electronics housing 12 from the meter base 14, it is contemplated that each snap hook 31 may be disengaged from the respective hook aperture 20 in turn, rather than all at once. If the snap hooks 31 are disengaged from the corresponding hook apertures 20 in turn, then the force required (at any single moment in time) to remove the electronics housing 12 from the meter base 14 may be reduced. For example, if a moderate 25 pound combined pushing force is required to flex all four of the housing guides 30 radially inward to release all four pairs of snap hooks 31 from the corresponding hook apertures 20, a user may only need to push on a single finger pad 32 with a smaller 6.25 pound pushing force at any given moment to disengage a particular pair of a snap hook 31 and a hook aperture 20. In this scenario in which each pair of a snap hook 31 and hook aperture 20 are disengaged in turn, a user may apply a continuous separation force by pulling on the electronics housing 12 as each finger pad 32 is depressed, such that once a first pair of a snap hook 31 and a hook aperture 20 are disengaged, the separation force prevents the first pair from re-engaging before the other three pairs of a snap hook 31 and a hook aperture 20 are disengaged.

Figures 2B, 2C:
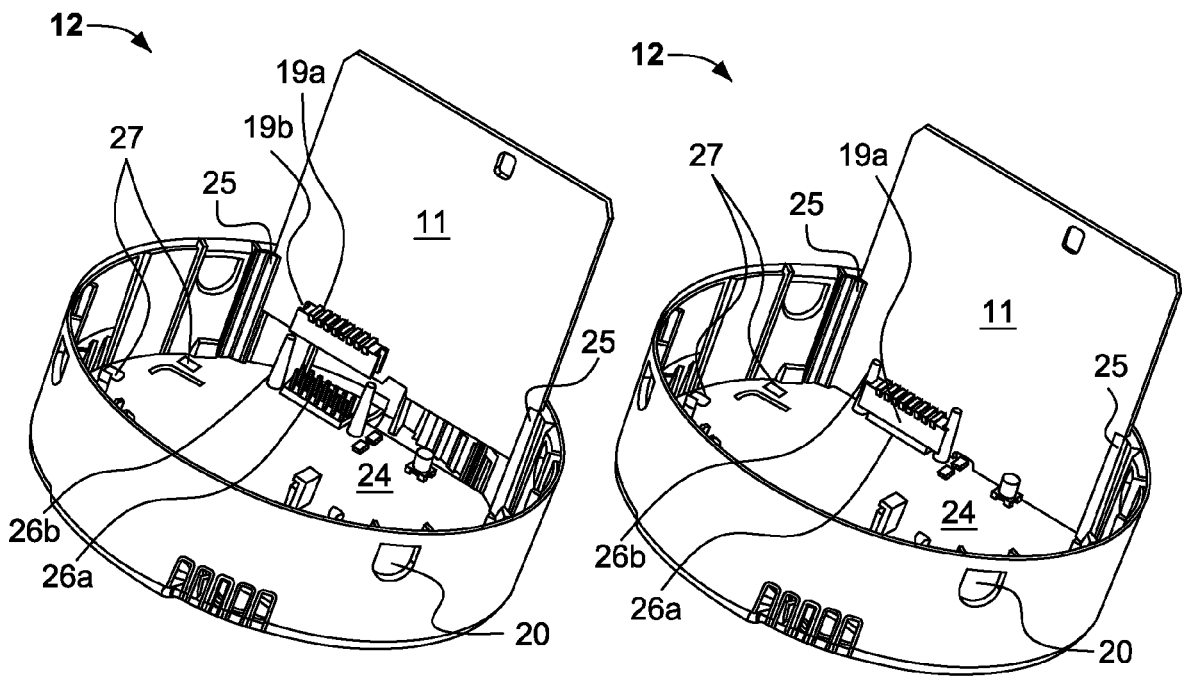
FIG. 2B is a top perspective view of the electronics housing depicted in FIG. 1A, including an option board partially mated to the main meter board.
FIG. 2C is a top perspective view of the electronics housing depicted in FIG. 1A, including an option board fully mated to the main meter board.

Referring to FIGS. 2A-2C, the electric meter 10 may further include one or more option boards (or option modules) 11. To support such option boards, the electronics housing 12 further includes a main meter board 24 disposed substantially parallel to the front panel 13 and a plurality of housing option board guides 25 disposed substantially perpendicular to the front panel 13. The main meter board 24 may include one or more option board headers 26a for receiving corresponding option board connectors 19a, one or more option board guide pins 26b for receiving corresponding option board guide slots 19b, and a plurality of voltage contact pads 27. The meter base 14 further includes a plurality of base option board guides 35 disposed substantially perpendicularly to the rear panel 15, a plurality of contact spring guides (or vertical risers) 36 disposed substantially perpendicularly to the rear panel 15, a plurality of voltage contact springs (or AC voltage contacts) 37 configured to contact corresponding voltage contact pads 27, and a plurality of meter terminal blades 38 penetrating through the rear panel 15.

As shown in FIG. 2A, the main meter board 24 is located in the electronics housing 12. The main meter board 24 may be secured in the desired position (disposed substantially parallel to the front panel 13) by one or more snaps or snap features (not shown) included in the electronics housing 12. The main meter board 24 may include metering functionality (i.e., measuring residential electric power consumption) and communication functionality via a two-way fixed network, wireless communication transceiver (not shown). Mobile AMR or any other communication mechanism known in the art may also be used to provide communication functionality for the electric meter 10. The main meter board 24 may include one or more option board headers 26a that allow one or more option boards 11 to mate with the option board headers 26a via corresponding option board connectors 19a, such that the option boards 11 are disposed substantially perpendicularly to the main meter board 24 (after assembly of the electric meter 10).

The option boards 11 are circuit boards that may be designed to perform one or more electric meter functions, for example, communications, detailed metering assets, or any other associated meter functions that are known in the art. As shown in FIG. 2A, in the assembled electric meter 10, the option boards 11 may be positioned in the housing option board guides 25 and the base option board guides 35. The option boards 11 are disposed substantially at right angles to the main meter board 24. Each option board 11 may include an option board connector 19a that is configured to be received in a corresponding option board header 26a. Each option board 11 may include one or more option board guide slots 19b located at opposite ends of corresponding option board connectors 19a. The option board guide slots 19b may be configured to receive the option board guide pins 26b during assembly of the electric meter 10.

The housing option board guides 25 may be located on the main meter board 24 or anywhere else on the electronics housing 12. The housing option board guides 25 may help guide the option boards 11 and the included option board connectors 19a (during assembly of the electric meter 10) into the option board headers 26a included on the main meter board 24. The option board headers 26a included on the main meter board 24 may be directly connected (after assembly of the electric meter 10) to right angle option board connectors 19a that are included on the option boards 11. The main meter board 24 may include one or more option board guide pins 26b located adjacent to opposite ends of corresponding option board headers 26a. The option board guide pins 26b may be configured to receive the option board guide slots 19b during assembly of the electric meter 10.

The configuration shown provides an electrical connection between the main meter board 24 and the option boards 11 without the use of any flying leads. While not being bound by theory, it is believed that the direct (e.g., devoid of flying leads) board-to-board interface between the option board headers 26a included on the main meter board 24 and the right angle option board connectors 19a included on the option boards 11 may improve the performance, reliability, and repeatability of the electric meter 10 when the option boards 11 are included.

The base option board guides 35 may be integrally formed with the meter base 14, although in other embodiments (not shown), the base option board guides 35 may be formed separately and attached to the meter base 14. The base option board guides 35 may be disposed substantially perpendicularly to the rear panel 15. The base option board guides 35 may secure the option boards 11 in the desired position (e.g., disposed substantially perpendicular to the rear panel 15 and the front panel 13) by the use of one or more snaps or snap features (not shown) included in the option board guides 35 in the meter base 14.

The voltage contact springs 37 may include spring-loaded arms to provide high voltage AC line connections from the meter base 14 to the electronics housing 12. The voltage contact springs 37 may provide a secondary electrical connection between the meter base 14 and the electronics housing 12 (e.g., in addition to the primary electrical connection between the main meter board 24 and the option boards 11).

The voltage contact springs 37 may be made from copper or any other electrically-conductive material that is known in the art. The voltage contact springs 37 are disposed substantially vertically (i.e., substantially perpendicular to the rear panel 15) along the contact spring guides 36, and the voltage contact springs 37 provide an electrical connection between the meter terminal blades 38 and the voltage contact pads 27 on the main meter board 24. The spring-loaded arms of the voltage contact springs 37 may be designed to properly align with the voltage contact pads 27 on the main meter board 24 and maintain reliable electrical connections between the meter terminal blades 38 and the main meter board 24 for the life of the electric meter 10, without the use of any flying leads. While not being bound by theory, it is believed that events like fast voltage transients and lightning may present a lower risk of damage to the electric meter 10 when no cables or flying leads are routed inside of the electric meter 10.

As shown in FIG. 2A, the electric meter 10 may be assembled via a "blind assembly" of the electronics housing 12 to the meter base 14. As used herein and in the claims, the term "blind assembly" means assembly without the need to manually align internal interconnecting components. To perform a blind assembly of the electronics housing 12 to the meter base 14, a user only needs to roughly align the hook apertures 20 with the snap hooks 31. In the embodiment shown, one or more of four sets of components may provide the connections between the electronics housing 12 to the meter base 14 to allow for blind assembly of the electric meter 10. The four sets of potentially meshing or mating components are: (1) the hook apertures 20 and the snap hooks 31, (2) the option boards 11 and the main meter board 24, (3) the housing option board guides 25 and the base option board guides 35, and (4) the voltage contact springs 37 and the voltage contact pads 27 included on the main meter board 24.

When performing a blind assembly of the electric meter 10, a user may grasp the electronics housing 12 and slide it over the meter base 14, while aligning the hook apertures 20 in the electronics housing 12 with the corresponding snap hooks 31 (or housing guides 30) in the meter base 14.

During the blind assembly, the option boards 11 are mated with the main meter board 24 and/or with the base option board guides 35. The right angle option board connectors 19a included on the option boards 11 may be directly connected to (or mate with) the integral option board headers 26a included on the main meter board 24, such that the option boards 11 are oriented substantially perpendicular to the main meter board 24. The blind assembly of the option board connectors 19a to the option board headers 26a may be assisted by the meshing of the guide slots 19b (located at opposite ends of the option board connectors 19a) with corresponding guide pins 26b (located adjacent to opposite ends of the option board headers 26a).

Before the blind assembly of the electric meter 10, the option boards 11 are inserted into the housing option board guides 25 or the base option board guides 35. During the blind assembly, the base option board guides 35 mesh or mate with the housing option board guides 25, enhancing the blind mate of the option boards 11 to the main meter board 24 and/or to the base option board guides 35. The housing option board guides 25 and the base option board guides 35 preferably orient the option boards 11 in a position that is substantially perpendicular to the main meter board 24.

During the blind assembly, the spring-loaded voltage contact springs 37 are mated with (e.g., establish contact with) voltage contact pads 27 included on the main meter board 24, thereby providing an electrical connection between the meter terminal blades 38 and the main meter board 24.

Referring to FIGS. 3A-3D, the electric meter 10 further includes one or more current sensors (or current sensing modules or current transformers) 40. Each current sensor 40 may include a potting shell 41, a central cavity 42, a mounting tube (or cylindrical-shaped aperture) 43, mating guides 44, and a snap hook mating surface 45. The meter base 14 further includes one or more central cavity posts 46, one or more mounting posts (or conical-shaped bosses) 47, one or more snap hook posts 48a, and one or more electrical conduits 49. Each snap hook post 48a includes a top hook 48b.

Each current sensor 40 may be a hall effect sensor module, a Rogowski current sensor, a current transformer sensor, or any other sensor capable of measuring residential electric power consumption that is known in the art. Before assembly of the electronics housing 12 to the meter base 14, one or more current sensors 40 may be located and securely mounted in the meter base 14.

Each current sensor 40 may be located onto the meter base 14 using three sets of features: (1) the central cavity 42 locating onto the central cavity post 46, (2) the mounting tube 43 locating onto the mounting post 47, and (3) the mating guides 44 locating around the snap hook post 48a. The combination of these three sets of features allows a current sensor 40 to be located in a single desired orientation, such that the installation of the current sensor 40 onto the meter base 14 can be accomplished via a "blind assembly."

Each current sensor 40 may be securely mounted onto the meter base 14 using two sets of features: (1) the mounting tube 43 mating to a mounting post 47, and (2) the mating guides 44 and the snap hook mating surface 45 mating to a snap hook post 48a.

The mounting tube 43 is a cylindrical-shaped aperture located towards the outside of the potting shell 41 of the current sensor 40. The mounting tube 43 may be tapered, narrowing in diameter from the bottom to the top of the current sensor 40. In some embodiments, the mounting tube 43 may have a constant diameter (i.e., non-tapered). The mounting post 47 is a conical-shaped boss rising substantially perpendicularly from the rear panel 15 of the meter base 14. The mounting post 47 may be tapered, narrowing in diameter as it protrudes away from the rear panel 15. In some embodiments, the mounting post 47 may have a constant diameter (i.e., non-tapered).

The mounting tube 43 and the mounting post 47 may be designed to mate when the current sensor 40 is positioned in the desired location in the meter base 14. For example, in some embodiments, the taper angle of the mounting tube 43 and the mounting post 47 are approximately equal, such that when the current sensor 40 is installed in the meter base 14, the fit between the mounting tube 43 and the mounting post 47 becomes tighter as the current sensor 40 moves down closer to the rear panel 15, thereby allowing the current sensor 40 to be securely mounted onto the meter base 14.

The mating guides 44 are flat protrusions extending vertically along the outside of the plotting shell 41 of the current sensor 40 from the top to the bottom. The snap hook mating surface 45 is a flat protrusion extending horizontally between the mating guides 44, located at or near the bottom of the plotting shell 41 of the current sensor 40. In some embodiments, the mating guides 44 and/or the snap hook mating surface 45 may have a non-flat shape, such as a curved shape. The snap hook post 48a is a post rising substantially perpendicularly from the rear panel of the meter base 14. The top hook 48b is a protrusion extending substantially perpendicularly from the snap hook post 48a.

The top surface of the plotting shell 41 of the current sensor 40 and the top hook 48b of the snap hook post 48a may be designed to mate when the current sensor 40 is positioned in the desired location in the meter base 14. For example, in some embodiments, the current sensor 40 is installed in the meter base 14 by aligning the central cavity 42 with a central cavity post 46 and aligning the mounting tube 43 with the mounting post 47 and beginning to push the current sensor 40 downward towards the rear panel 15. As the current sensor 40 is pushed downward, the hook mating surface 45 slips under the top hook 48b. As the current sensor 40 continues to be pushed downward, the top surface of the plotting shell 41 slips under the top hook 48b. The latching of the top hook 48b over the top surface of the plotting shell 41 may allow the current sensor 40 to be securely mounted onto the meter base 14.

Figure 3C:
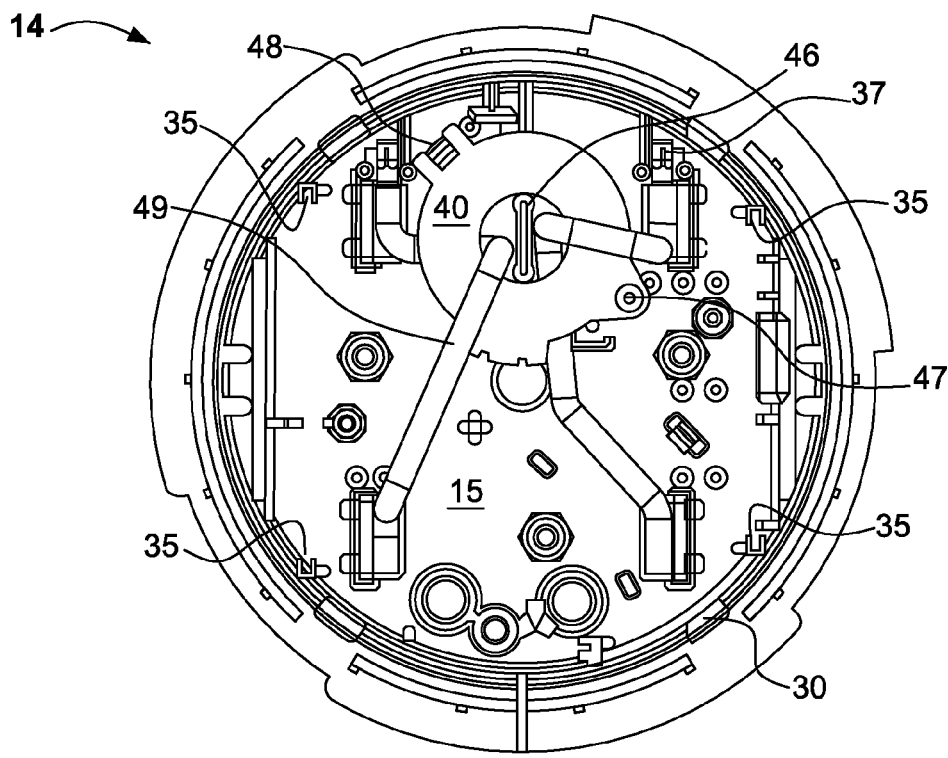
FIG. 3C is a top plan view of the meter base depicted in FIG. 3A.

As best shown in FIG. 3C, the electrical conduits 49 provide an electrical connection between the meter terminal blades 38 that have the same type of charge. For example, a first electrical conduit 49 may connect a first pair of meter terminal blades 38 that carry a positive charge when an electrical current is passed through the first pair of meter terminal blades 38, while a second electrical conduit 49 may connect a second pair of meter terminal blades 38 that carry a negative charge when an electrical current is passed through the second pair of meter terminal blades 38.

Figure 4:
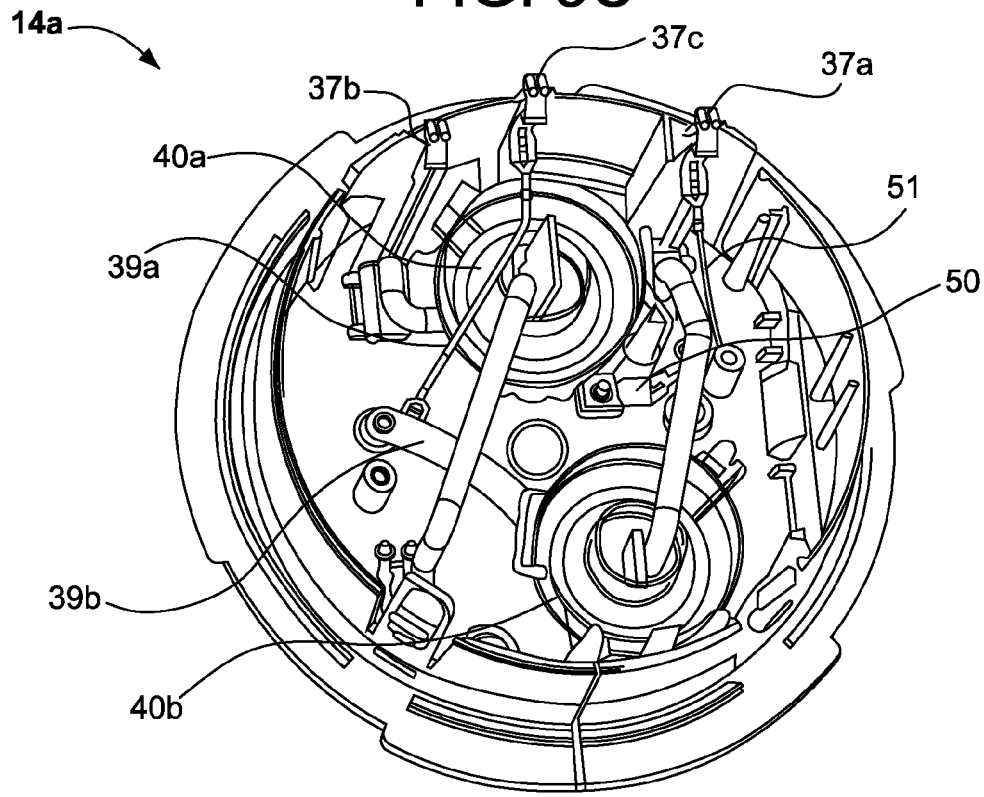
FIG. 4 is a top perspective view of a meter base including two current transformers and a service disconnect link, according to a second embodiment.

Referring to FIG. 4, a second embodiment of an electric meter 10a includes a meter base 14a. The meter base 14a includes a first current sensor (or current transformer) 40a, a second current sensor (or current transformer) 40b, a service disconnect switch 50, a switch interface option board 11a (not shown), a first charge voltage contact spring 37a, a second charge voltage contact spring 37b, and a neutral voltage contact spring 37c, a neutral lead 39a, and a neutral linkage 39b. The service disconnect switch 50 includes a disconnect lead 51.

The service disconnect switch 50 electric meter may be a 200 amp, whole house, service disconnect switch. The service disconnect switch 50 may be coupled to the meter base 14. As shown, the disconnect lead 51 electrically connects the service disconnect switch 50 to the first charge voltage contact spring 37a. In other embodiments, the disconnect lead 51 may connect the service disconnect switch 50 to the second charge voltage contact spring 37b. In use, the service disconnect switch 50 may alternatively allow or prevent the passage of current between the first charge voltage contact spring 37a and the corresponding meter terminal blades 38 that carry current of the same charge.

While not being bound by theory, it is believed that having a single design for the electric meter 10a and the meter base 14a that allows a user to either incorporate or omit a service disconnect switch 50 may allow all installed electric meters 10a to have the same external look, thereby potentially preventing embarrassment of potential non-pay customers who have an electric meter 10a incorporating a service disconnect switch 50. Also, a single design for electric meters 10a with and without a service disconnect switch 50 may allow for more efficient manufacturing of the electric meters 10a.

After assembly of the electric meter 10a, the first charge voltage contact spring 37a, the second charge voltage contact spring 37b, and the neutral voltage contact spring 37c may be electrically connected to the voltage contact pads 27 in the main meter board 24. After installation and activation of the electric meter 10a, the first charge voltage contact spring 37a may carry either a positive or negative charge and the second charge voltage contact spring 37b may carry the opposite charge of that carried by the first charge voltage contact spring 37b.

The neutral lead 39a and the neutral linkage 39b may provide electrical grounding to the first current sensor 40a, the second sensor 40b, and/or the main meter board 24 via the neutral voltage contact spring 37c.

Referring to FIGS. 5A-6B, a third embodiment of an electric meter 10b includes a meter base 14b and a current sensor 60. The current sensor 60 includes a plotting shell 61, a central cavity 62, a snap hook guide 63, a snap hook mating surface 64, a plurality of contact spring guides (or vertical risers) 65 disposed substantially perpendicularly to the rear panel 15b, and a plurality of voltage contact springs 66. The meter base 14b includes a rear panel 15b, one or more central cavity posts 67, one or more snap hook posts 68. Each snap hook post 68 includes a hook aperture 69.

Each current sensor 60 may be a hall effect sensor module, a Rogowski current sensor, a current transformer sensor, or any other sensor capable of measuring residential electric power consumption that is known in the art. Before assembly of an electronics housing 12 to the meter base 14b, one or more current sensors 60 may be located and securely mounted in the meter base 14b.

Each current sensor 60 may be located onto the meter base 14b using two sets of features: (1) the central cavity 62 locating onto the central cavity post 67, and (2) the snap hook guide 63 locating in the snap hook post 68. The combination of these two sets of features may allow a current sensor 60 to be located in a single desired orientation (e.g., one unique position for each current sensor 60 in the meter base 14b), such that the installation of the current sensor 60 onto the meter base 14b can be accomplished via a "blind assembly." Each current sensor 60 may be securely mounted onto the meter base 14b by mating the snap hook mating surface 64 to the hook aperture 69 of a snap hook post 68.

The snap hook guide 63 is a protrusion extending away from the outer surface of the plotting shell 61 of the current sensor 60. The snap hook mating surface 64 is a flat protrusion extending horizontally along the snap hook guide 63 and located near the bottom of the snap hook guide 63. In some embodiments, the snap hook mating surface 64 may have a non-flat shape, such as a curved shape. The snap hook post 68 is a protrusion rising substantially perpendicularly from the rear panel 15b of the meter base 14b. The hook aperture 69 is an aperture extending through the snap hook post 68 substantially parallel to the rear panel 15b.

The snap hook guide 63 and the snap hook post 68 are designed to mate when the current sensor 60 is positioned in the desired location in the meter base 14. The snap hook mating surface 64 and the hook aperture 69 are also designed to mate when the current sensor 60 is positioned in the desired location in the meter base 14b. For example, in some embodiments, the current sensor 60 is installed in the meter base 14b by aligning the central cavity 62 with a central cavity post 67 and aligning the snap hook guide 63 with the snap hook post 68 and beginning to push the current sensor 60 downward towards the rear panel 15b. As the current sensor 60 is pushed downward, the snap hook mating surface 64 slips into the hook aperture 69. The latching of snap hook mating surface 64 into the hook aperture 69 may allow the current sensor 60 to be securely mounted onto the meter base 14b.

The voltage contact springs 66 may include spring-loaded arms to provide high voltage AC line connections to a main meter board 24 and option boards 11. The voltage contact springs 66 may be made from copper or any other electrically-conductive material that is known in the art. The voltage contact springs 66 are disposed substantially vertically (i.e., substantially perpendicular to the rear panel 15b) along the contact spring guides 65, and the voltage contact springs 66 provide an electrical connection between the meter terminal blades 38 and the voltage contact pads 27 on the main meter board 24. The spring-loaded arms of the voltage contact springs 66 may be designed to properly align with the voltage contact pads 27 on the main meter board 24 and maintain reliable electrical connections between the meter terminal blades 38 and the main meter board 24 for the life of the electric meter 10b, without the use of any flying leads. While not being bound by theory, it is believed that events like fast voltage transients and lightning may present a lower risk of damage to the electric meter 10b when no cables or flying leads are routed inside of the electric meter 10b.

Figure 6A:
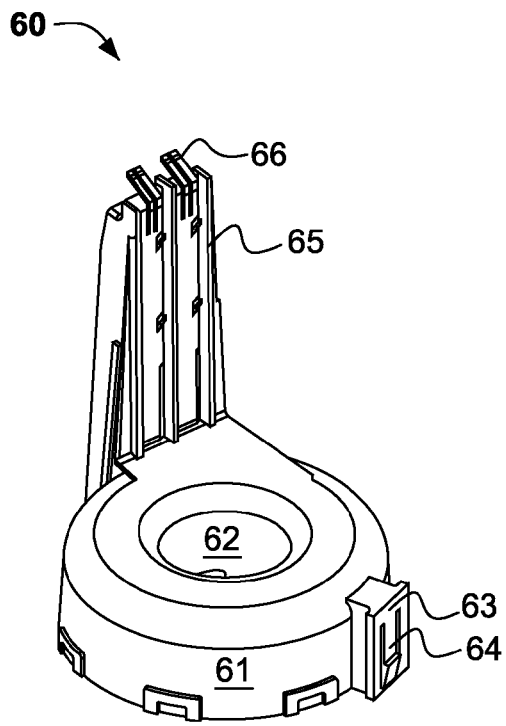
FIG. 6A is a top perspective view of the current transformer depicted in FIG. 5A.
Figure 6B:
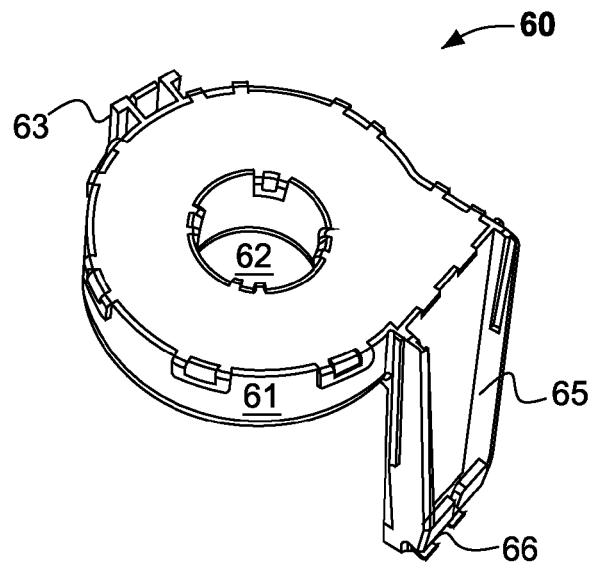
FIG. 6B is a bottom perspective view of the current transformer depicted in FIG. 6A.
Figure 6C:
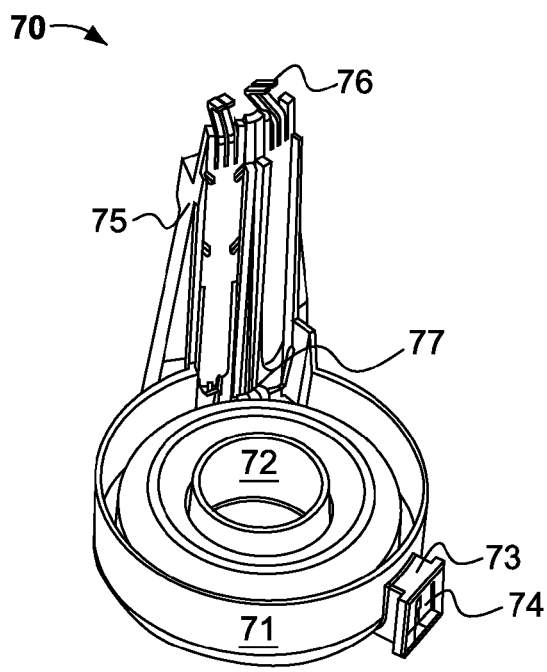
FIG. 6C is a top perspective view of a current transformer, according to a fourth embodiment.

Referring to FIG. 6C, a fourth embodiment current sensor 70 includes a plotting shell 71, a central cavity 72, a snap hook guide 73, a snap hook mating surface 74, a plurality of contact spring guides (or vertical risers) 75 disposed substantially perpendicularly to the plotting shell 71, a plurality of voltage contact springs 76, and a hinge 77. The current sensor 70 may be a hall effect sensor module, a Rogowski current sensor, a current transformer sensor, or any other sensor capable of measuring residential electric power consumption that is known in the art.

One or more current sensors 70 may be securely mounted in a meter base such as the meter base 14b shown in FIGS. 5A-5C. Each current sensor 70 may be located onto the meter base 14b using two sets of features: (1) the central cavity 72 locating onto the central cavity post 67, and (2) the snap hook guide 73 locating in the snap hook post 68. The combination of these two sets of features may allow a current sensor 70 to be located in a single desired orientation (e.g., one unique position for each current sensor 70 in the meter base 14b), such that the installation of the current sensor 70 onto the meter base 14b can be accomplished via a "blind assembly." Each current sensor 70 may be securely mounted onto the meter base 14b by mating the snap hook mating surface 74 to the hook aperture 69 of a snap hook post 68.

The voltage contact springs 76 may include spring-loaded arms to provide high voltage AC line connections to a main meter board 24 and option boards 11. The voltage contact springs 76 may be made from copper or any other electrically-conductive material that is known in the art. The voltage contact springs 76 are disposed substantially vertically (i.e., substantially perpendicular to the plotting shell 71) along the contact spring guides 75, and the voltage contact springs 76 provide an electrical connection between the meter terminal blades 38 and the voltage contact pads 27 on the main meter board 24. The spring-loaded arms of the voltage contact springs 76 may be designed to properly align with the voltage contact pads 27 on the main meter board 24 and maintain reliable electrical connections between the meter terminal blades 38 and the main meter board 24 for the life of the electric meter 10b, without the use of any flying leads.

The hinge 77 may allow the contact spring guides 75 to pivot about the longitudinal axis of the hinge 77. Having the contact spring guides 75 being able to pivot about the hinge 77 may allow the upper end of the voltage contact springs 76 to have some freedom of motion relative to the plotting shell 71. This freedom of motion of the voltage contact springs 76 may allow a single current sensor 70 to provide an electrical connection between the voltage contact springs 76 and the voltage contact pads 27 that may be located in varying positions (e.g., various horizontal and/or vertical positions) on respective main meter boards 24. The hinge 77 may include a spring functionality that may bias the contact spring guides 75 towards a vertical position, which may result in an increased contact force between the voltage contact springs 76 and the voltage contact pads 27 on the main meter board 24 after assembly of the electric meter 10b.

Figure 7A:
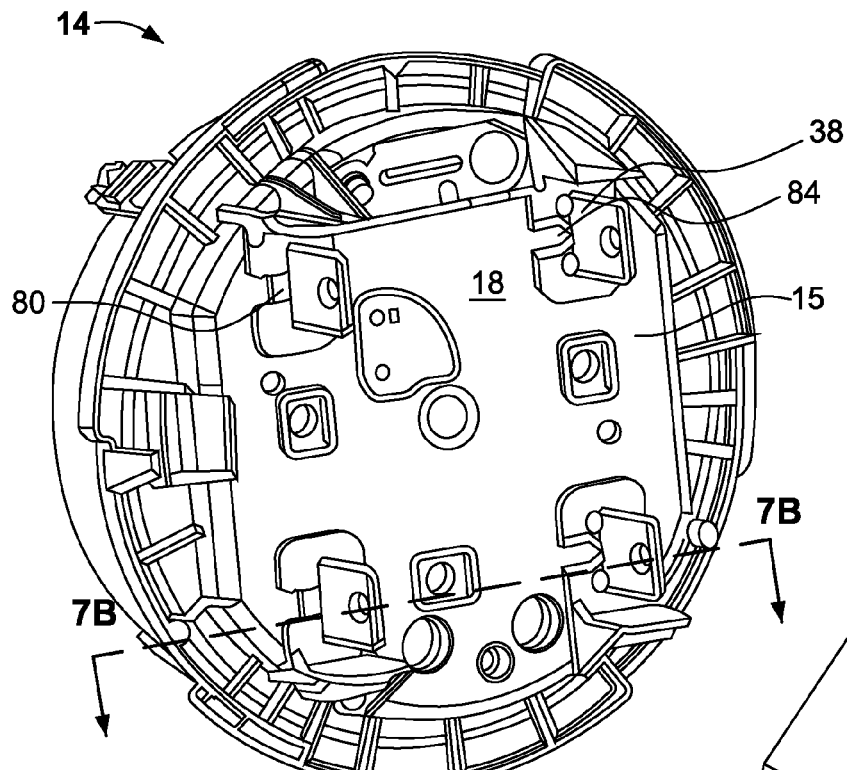
FIG. 7A is a bottom perspective view of the meter base depicted in FIG. 1C.
Figure 7C:
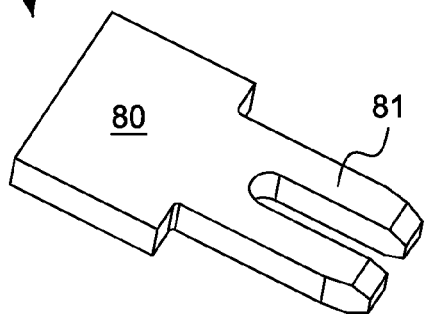
FIG. 7C is a top perspective view of the retaining key depicted in FIG. 7A.
Figure 7B:
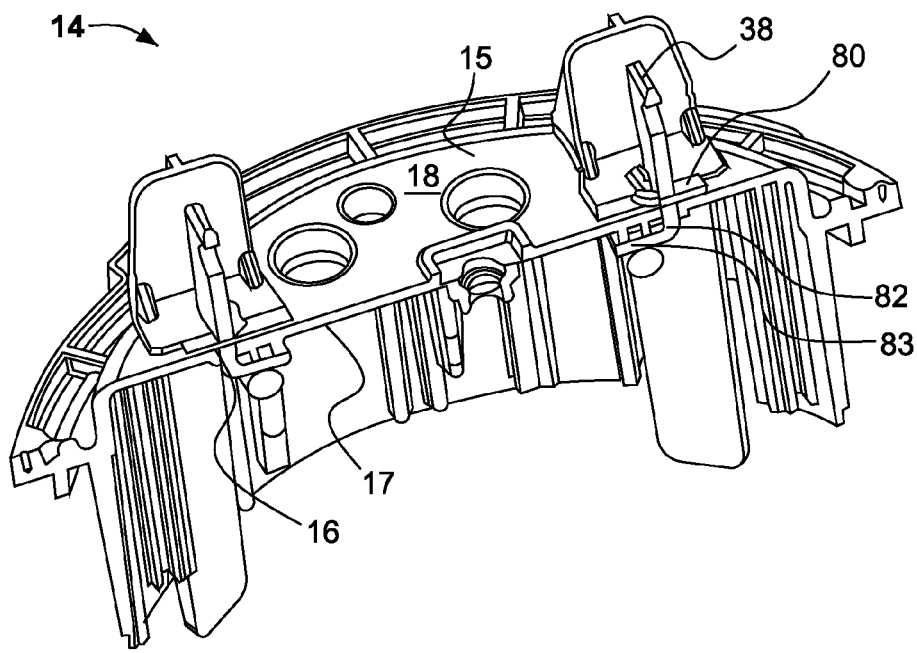
FIG. 7B is a bottom perspective sectional view of the meter base depicted in FIG. 7A, taken along the line 7B-7B.

Referring to FIGS. 7A-7C, the electric meter 10 further includes a plurality of retaining keys 80. Each retaining key 80 includes two legs 81. The meter base 14 further includes a top surface 17 and a bottom surface 18. Each meter terminal blade 38 includes a bend 82, a spring contact portion 83 and a retaining key aperture 84.

As shown, the electric meter 10 includes four meter terminal blades 38. In the present embodiment, the four meter terminal blades 38 are grouped into a first pair of meter terminal blades 38 assigned to carry a first type of charge (e.g., positive) and a second pair of meter terminal blades 38 assigned to carry a second type of charge (e.g., negative). Each group of similarly-charged meter terminal blades 38 may be electrically connected by an electrical conduit 49 (for example, as shown in FIG. 3C). Each meter terminal blades 38 may be electrically connected to the main meter board 24 via a voltage contact spring 37.

Prior to assembly of the electronics housing 12 onto the meter base 14, each meter terminal blade 38 may be inserted (or installed) into the meter base 14 through a respective meter terminal blade aperture 16 (i.e., slots in the meter base 14). Each meter terminal blade 38 may include a bend 82 (e.g., a substantially right-angle bend) that may allow the spring contact portion 83 to operate as a spring compression mechanism to retain a respective voltage contact spring 37 against the top surface 17 of the meter base 14. The size of the spring contact portion 83 of each meter terminal blade 38 is determined by the location of the bend 82 along the meter terminal blade 38.

Each meter terminal blade 38 may be retained or secured against the rear panel 15 of the meter base 14 by a respective retaining key 80. Each retaining key 80 may be inserted into a respective meter terminal blade 38 through a retaining key aperture 84. The location of the bend 82 may be chosen such that the retaining key aperture 84 is positioned proximate to the bottom surface 18 of the meter base 14, thereby allowing the retaining key 80 to be positioned against the bottom surface 18 of the meter base 14 after the retaining key is inserted into the retaining key aperture 84. After the retaining key 80 is inserted into the retaining key aperture 84, the two legs 81 of the retaining key 80 may be bent against the outer edges of the retaining key aperture 84 with a tool (not shown), such that the meter terminal blade 38 is secured against the rear panel 15 of the meter base 14.

The foregoing description is provided for the purpose of explanation and is not to be construed as limiting the invention. While the invention has been described with reference to preferred embodiments or preferred methods, it is understood that the words which have been used herein are words of description and illustration, rather than words of limitation. Furthermore, although the invention has been described herein with reference to particular structure, methods, and embodiments, the invention is not intended to be limited to the particulars disclosed herein, as the invention extends to all structures, methods and uses that are within the scope of the appended claims. The disclosed electric meter may address some or all of the problems previously described. A particular embodiment need not address all of the problems described, and the claimed electric meter should not be limited to embodiments comprising solutions to all of these problems. Further, several advantages have been described that flow from the structure and methods; the present invention is not limited to structure and methods that encompass any or all of these advantages. Those skilled in the relevant art, having the benefit of the teachings of this specification, may effect numerous modifications to the invention as described herein, and changes can be made without departing from the scope and spirit of the invention as defined by the appended claims. Furthermore, any features of one described embodiment can be applicable to the other embodiments described herein.

What is claimed:

1. An electric meter, comprising:
    an electronics housing defining a front panel, the electronics housing including a first plurality of option board guides and a main meter board disposed substantially parallel to the front panel; and
    a meter base defining a rear panel, the meter base including a plurality of housing guides for receiving the electronics housing and a second plurality of option board guides disposed substantially perpendicularly to the rear panel, the second plurality of option board guides adapted to receive an option board and to position the option board substantially perpendicularly to the main meter board of the electronics housing during assembly of the electronics housing to the meter base;

wherein the housing guides in combination with the first and second pluralities of option board guides enable blind assembly of the electronics housing to the meter base.

2. The electric meter of claim 1, wherein the first and second pluralities of option board guides further enable an electrical connection between the option board and the main meter board during assembly of the electronics housing to the meter base, the electrical connection being devoid of flying leads.

3. The electric meter of claim 1, wherein the meter base further includes spring-loaded arms that are adapted to provide an electrical connection between the meter base and the electronics housing during assembly of the electronics housing to the meter base.

4. The electric meter of claim 1, further comprising a current transformer, the current transformer mounted onto the meter base by a self-location post and a snap feature.

5. The electric meter of claim 4, wherein the current transformer includes spring-loaded arms that are adapted to provide an electrical connection between the current transformer and the main meter board during assembly of the electronics housing to the meter base.

6. The electric meter of claim 5, wherein the electrical connection is a secondary electrical connection between the meter base and the electronics housing.

7. The electric meter of claim 5, wherein the spring-loaded arms provide the only direct electrical connection between the current transformer and the main meter board.

8. The electric meter of claim 1, wherein the first plurality of option board guides is adapted to mate with the second plurality of option board guides during assembly of the electronics housing to the meter base.

9. The electric meter of claim 1, wherein the main meter board is coupled to the electronics housing by one fastener.

10. The electric meter of claim 1, further comprising a whole house service disconnect switch.

11. The electric meter of claim 1, further comprising a plurality of current conductor blades, each blade having a right angle bend, protruding through the meter base, and being pinned to the meter base by a conductor blade key.

12. An electric meter, comprising:
an electronics housing defining a front panel, the electronics housing including a first plurality of option board guides and a main meter board disposed substantially parallel to the front panel;
a meter base defining a rear panel, the meter base including a plurality of housing guides for receiving the electronics housing and a second plurality of option board guides disposed substantially perpendicularly to the rear panel, the second plurality of option board guides adapted to receive an option board and to position the option board substantially perpendicularly to the main meter board of the electronics housing during assembly of the electronics housing to the meter base; and
an option board, the option board received in the first and second pluralities of option board guides and positioned substantially perpendicularly to the main meter board of the electronics housing;
wherein the housing guides in combination with the first and second pluralities of option board guides enable blind assembly of the electronics housing to the meter base; and
wherein the electronics housing is assembled to the meter base.

13. The electric meter of claim 12, wherein there is an electrical connection between the option board and the main meter board, the electrical connection being devoid of flying leads.

14. The electric meter of claim 12, wherein the meter base further includes spring-loaded arms that provide an electrical connection between the meter base and the electronics housing.

15. The electric meter of claim 12, further comprising a current transformer, the current transformer mounted onto the meter base by a self-location post and a snap feature.

16. The electric meter of claim 15, wherein the current transformer includes spring-loaded arms that provide an electrical connection between the current transformer and the main meter board.

17. The electric meter of claim 16, wherein the electrical connection is a secondary electrical connection between the meter base and the electronics housing.

18. The electric meter of claim 16, wherein the spring-loaded arms provide the only direct electrical connection between the current transformer and the main meter board.

19. The electric meter of claim 12, wherein the first plurality of option board guides is mated with the second plurality of option board guides.

20. The electric meter of claim 12, wherein the main meter board is coupled to the electronics housing by one fastener.

21. The electric meter of claim 12, further comprising a whole house service disconnect switch.

22. The electric meter of claim 12, further comprising a plurality of current conductor blades, each blade having a right angle bend, protruding through the meter base, and being pinned to the meter base by a conductor blade key.

23. A method of assembling an electric meter, comprising:
providing an electronics housing defining a front panel, the electronics housing including a first plurality of option board guides and a main meter board disposed substantially parallel to the front panel;
providing a meter base defining a rear panel, the meter base including a plurality of housing guides for receiving the electronics housing and a second plurality of option board guides disposed substantially perpendicularly to the rear panel, the second plurality of option board guides adapted to receive an option board and to position the option board substantially perpendicularly to the main meter board of the electronics housing during assembly of the electronics housing to the meter base;
inserting an option board into the second plurality of option board guides; and
performing a blind assembly of the electronics housing to the meter base, wherein the option board and main board are connected during said blind assembly.

24. The method of claim 23, further comprising the steps of providing spring-loaded arms in the meter base and using the spring-loaded arms to provide an electrical connection between the meter base and the electronics housing.

25. The method of claim 23, further comprising the step of mounting a current transformer onto the meter base by a self-location post and a snap feature.

26. The method of claim 25, further comprising the steps of providing spring-loaded arms in the current transformer and using the spring-loaded arms to provide an electrical connection between the current transformer and the main meter board.

27. The method of claim 26, wherein the spring-loaded arms provide the only direct electrical connection between the current transformer and the main meter board.

28. The method of claim 23, further comprising the step of mating the first plurality of option board guides with the second plurality of option board guides.

29. The method of claim 23, further comprising the step of coupling the main meter board to the electronics housing by one fastener.

30. The method of claim 23, further comprising the steps of providing a plurality of current conductor blades, inserting each blade through the meter base, and pinning each blade to the meter base by a conductor blade key.

* * * * *